(12) United States Patent
Choi et al.

(10) Patent No.: US 7,550,823 B2
(45) Date of Patent: Jun. 23, 2009

(54) NONVOLATILE MEMORY CELL, ARRAY THEREOF, FABRICATION METHODS THEREOF AND DEVICE COMPRISING THE SAME

(75) Inventors: Byoung Deog Choi, Suwon-si (KR); Jun Sin Yi, Suwon-si (KR); Sung Wook Jung, Suwon-si (KR); Sung Hyung Hwang, Suwon-si (KR)

(73) Assignee: Samsung Mobile Display Co., Ltd., Suwon-si (KR)

( * ) Notice: Subject to any disclaimer, the term of this patent is extended or adjusted under 35 U.S.C. 154(b) by 0 days.

(21) Appl. No.: 11/777,657

(22) Filed: Jul. 13, 2007

(65) Prior Publication Data

US 2008/0121888 A1  May 29, 2008

(30) Foreign Application Priority Data

Nov. 24, 2006 (KR) .................... 10-2006-0117153

(51) Int. Cl.
| | |
|---|---|
| H01L 23/58 | (2006.01) |
| H01L 23/48 | (2006.01) |
| H01L 23/52 | (2006.01) |
| H01L 29/40 | (2006.01) |
| H01L 29/76 | (2006.01) |
| H01L 29/94 | (2006.01) |
| H01L 31/062 | (2006.01) |
| H01L 31/113 | (2006.01) |
| H01L 31/119 | (2006.01) |
| H01L 29/04 | (2006.01) |
| H01L 29/06 | (2006.01) |
| H01L 21/336 | (2006.01) |
| H01L 21/8234 | (2006.01) |

(52) U.S. Cl. ............... 257/639; 257/3; 257/9; 257/406; 257/411; 257/649; 257/760; 438/197; 438/287; 977/720; 977/721; 977/723; 977/773; 977/774; 977/784; 977/785

(58) Field of Classification Search ............ 257/3, 257/9, 406, 411, 639, 649, 760; 438/197, 438/287; 977/720–721, 723, 773–774, 784–785
See application file for complete search history.

(56) References Cited

U.S. PATENT DOCUMENTS 6,274,007 B1 * 8/2001 Smirnov et al. ......... 204/192.13

(Continued)

FOREIGN PATENT DOCUMENTS

KR 2001-92958 10/2001

(Continued)

OTHER PUBLICATIONS

Notice of Allowance issued by Korean Intellectual Property Office in Korean Patent Application No. 2006-117153 on May 13, 2008.

*Primary Examiner*—Ida M Soward
(74) *Attorney, Agent, or Firm*—Stein, McEwen & Bui, LLP

(57) ABSTRACT

A nonvolatile memory cell is capable of reducing an excessive current leakage due to a rough surface of a polysilicon and of performing even at a low temperature process by forming the first oxide film including a silicon oxynitride (SiOxNy) layer using nitrous oxide plasma and by forming a plurality of silicon nanocrystals in a nitride film by implanting a silicon nanocrystal on the nitride film by an ion implantation method, and a fabricating method thereof and a memory apparatus including the nonvolatile memory cell.

23 Claims, 7 Drawing Sheets

U.S. PATENT DOCUMENTS

| | | | | |
|---|---|---|---|---|
| 6,400,610 | B1 * | 6/2002 | Sadd | 365/185.29 |
| 6,784,103 | B1 * | 8/2004 | Rao et al. | 438/680 |
| 6,804,136 | B2 * | 10/2004 | Forbes | 365/94 |
| 6,872,614 | B2 * | 3/2005 | Fujiwara | 438/201 |
| 7,110,299 | B2 * | 9/2006 | Forbes | 365/185.18 |
| 7,148,106 | B2 * | 12/2006 | Joo et al. | 438/257 |
| 7,208,793 | B2 * | 4/2007 | Bhattacharyya | 257/314 |
| 7,341,914 | B2 * | 3/2008 | Prinz et al. | 438/260 |
| 7,361,543 | B2 * | 4/2008 | Steimle et al. | 438/201 |
| 7,399,675 | B2 * | 7/2008 | Chindalore et al. | 438/266 |
| 2006/0166435 | A1 * | 7/2006 | Teo et al. | 438/257 |

FOREIGN PATENT DOCUMENTS

| | | |
|---|---|---|
| KR | 2005-40534 | 5/2005 |
| KR | 2006-15373 | 2/2006 |
| KR | 2006-18532 | 3/2006 |

\* cited by examiner

NONVOLATILE MEMORY CELL, ARRAY THEREOF, FABRICATION METHODS THEREOF AND DEVICE COMPRISING THE SAME

CROSS-REFERENCE TO RELATED APPLICATIONS

This application claims the benefit of Korean Application No. 2006-117153, filed Nov. 24, 2006, in the Korean Intellectual Property Office, the disclosure of which is incorporated herein by reference.

BACKGROUND OF THE INVENTION

1. Field of the Invention

Aspects of the present invention relate to a nonvolatile memory cell and a fabrication method thereof.

2. Description of the Related Art

Generally, nonvolatile memory devices may be classified as floating-gate memory devices and charge-trapping memory devices. Floating-gate memory devices are devices that maintain a charge by using a potential well. Charge-trapping memory devices are devices that trap charges in a trap region inside a nitride film, or in a trap region present in an interface between a nitride film and an insulator.

A representative form of a charge-trapping memory device is a Silicon-Oxide-Nitride-Oxide-Silicon (SONOS) configuration. Typically, the SONOS configuration may include a sequential stack of a semiconductor substrate, an ONO configuration, and a gate electrode. The ONO configuration may include a sequential stack of a tunneling oxide film, a nitride film, and a blocking oxide film. The tunneling oxide film may tunnel electrons into a trap region inside the nitride film, or a trap region at an interface of the nitride film. The blocking oxide film may block charges from moving between the nitride film and the gate electrode. The trap region may store charges. Source/drain regions may be provided in the semiconductor substrate on either side of this stack.

Recently, the creation of a nonvolatile memory device on a glass substrate has been investigated. Such a configuration may include a sequential stack of the glass substrate, the ONO configuration, and the gate electrode. The glass substrate may include a protective layer, e.g., a buffer oxide film thereon, to protect the glass substrate. A polysilicon layer may be provided on the protective layer. Source/drain regions may be provided in the polysilicon layer on either side of this stack.

The creation of the polysilicon layer may include crystallizing an amorphous polysilicon layer, e.g., by irradiating the amorphous polysilicon layer with a laser. Thus, surfaces of the polysilicon layers may be rough and non-uniform, which may result in a large current leakage being generated. In other words, a current leakage may be significantly increased due to the non-uniformity and roughness of the surfaces of the polysilicon layer. Therefore, such a nonvolatile memory may function abnormally during storing/erasing operations

SUMMARY OF THE INVENTION

Aspects of the present invention are therefore directed to a nonvolatile memory cell, a fabrication method therefore, and an array including the nonvolatile memory cell, that substantially overcomes one or more of the problems of the related art and/or other problems.

An embodiment of the present invention provides a nonvolatile memory cell on a glass substrate. The nonvolatile memory cell can have a reduced a current leakage caused by the surface roughness of a polysilicon layer. The nonvolatile memory cell can be manufactured using a low temperature process. The low temperature process can include forming a first oxide film, including a silicon oxynitride (SiOxNy) layer, by using a nitrous oxide ($N_2O$) plasma. The method can comprise forming a plurality of silicon nanocrystals in a nitride film. The silicon nanocrystals can be formed from silicon ions implanted in the nitride film by an ion implantation method. The present teaching also encompass a fabrication method, and a memory apparatus including the nonvolatile memory cell.

The nonvolatile memory cell can include: a buffer oxide film on a substrate; a polysilicon layer on the buffer oxide film; a first insulator, including a sequential stack of, a silicon oxynitride (SiOxNy) layer and a silicon dioxide ($SiO_2$) layer, on the polysilicon layer; a nitride film, including a plurality of silicon nanocrystals, on the first insulator; a second insulator on the nitride film; a gate electrode on the second insulator; and a source and drain comprising impurity ions, both disposed in exposed regions of the polysilicon layer. The impurity ions can be injected into the polysilicon layer.

The present teachings include a method of fabricating a nonvolatile memory cell, including: forming a buffer oxide film on a substrate; forming a polysilicon layer on the buffer oxide film; forming a first insulator, including a sequential stack, of a silicon oxynitride (SiOxNy) layer and a silicon dioxide ($SiO_2$) layer, on the polysilicon layer, using a nitrous oxide ($N_2O$) plasma; forming an nitride film on the first insulator; forming a plurality of silicon nanocrystals in a nitride film from ion implanted silicon atoms in the nitride film; forming a second insulator on the nitride film; forming a gate electrode on the second insulator; and forming a source and a drain in exposed regions of the polysilicon layer by injecting impurities.

The present teachings comprise an array of nonvolatile memory cells comprising a field region at least partially defining an active region, and a word line crossing the active region and the field region. The nonvolatile memory apparatus includes a nonvolatile memory cell formed at an intersection of the word line and the active region. The nonvolatile memory cell can also comprise: a buffer oxide film on a substrate; a polysilicon layer on the buffer oxide film; a first insulator, including a sequential stack, of a silicon oxynitride (SiOxNy) layer and a silicon dioxide ($SiO_2$) layer, on the polysilicon layer; a nitride film, including a plurality of silicon nanocrystals, on the first insulator; a second insulator on the nitride film; a gate electrode on the second insulator; and a source and a drain, comprising impurity ions, disposed at exposed regions of the polysilicon layer.

The present teachings comprise a display device, for example, a flat panel display device. The flat panel display device can include a power source, a memory, a program section, a buffer section, and a panel section. The memory section includes a nonvolatile memory cell. The nonvolatile memory cell includes: a buffer oxide film on a substrate; a polysilicon layer on the buffer oxide film; a first insulator, including a sequential stack, of a silicon oxynitride (SiOxNy) layer and a silicon dioxide ($SiO_2$) layer, on the polysilicon layer; a nitride film including a plurality of silicon nanocrystals in the first insulator; a second insulator on the nitride film; a gate electrode on the second insulator; a source; and a drain.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1A:
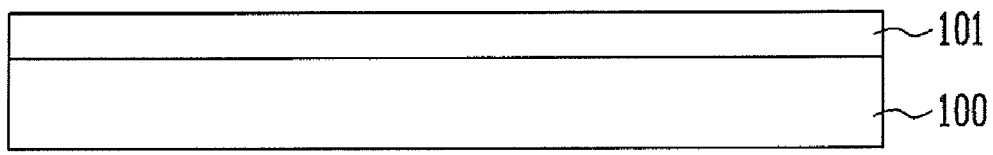
FIGS. 1A to FIG. 1I illustrate cross-sectional views of stages of a method of fabricating a nonvolatile memory cell, according to an exemplary embodiment of the present invention.

Reference will now be made in detail to the various embodiments of the present invention, examples of which are illustrated in the accompanying drawings, wherein like reference numerals refer to the like elements throughout. The exemplary embodiments are described below in order to explain the present invention by referring to the figures.

In the figures, the dimensions of the various layers and regions may be exaggerated for clarity. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, or one or more intervening layers may also be present.

In addition, it will also be understood that when a layer is referred to as being "between" two layers, it can be the only layer between the two layers, or one or more intervening layers may also be present. When one element is connected to another element, one element may be not only directly connected to another element but also indirectly connected to another element via another element. Further, irrelevant elements are omitted for clarity. Also, like reference numerals refer to like elements throughout.

Figure 1B:
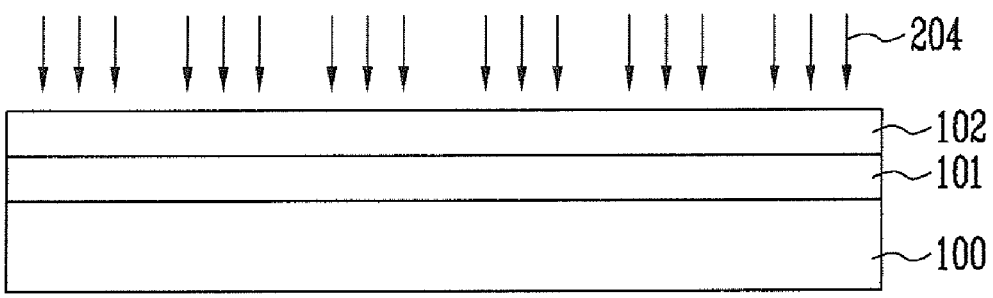
Figure 1C:
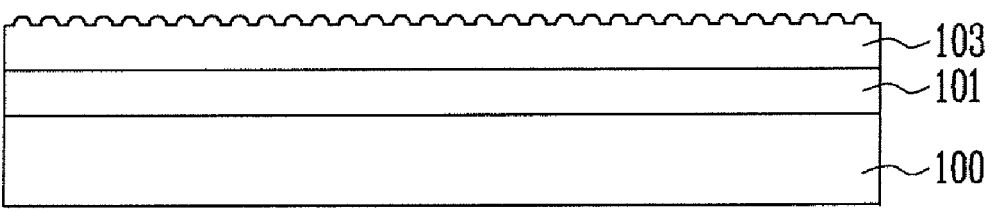
Figure 1D:
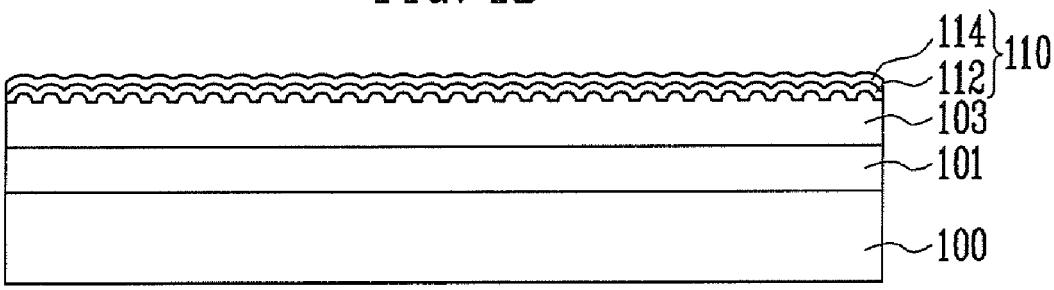
Figure 1E:
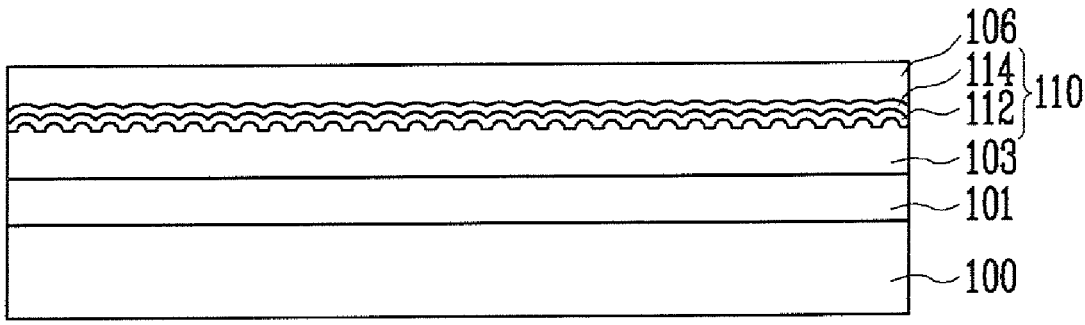
Figure 1F:
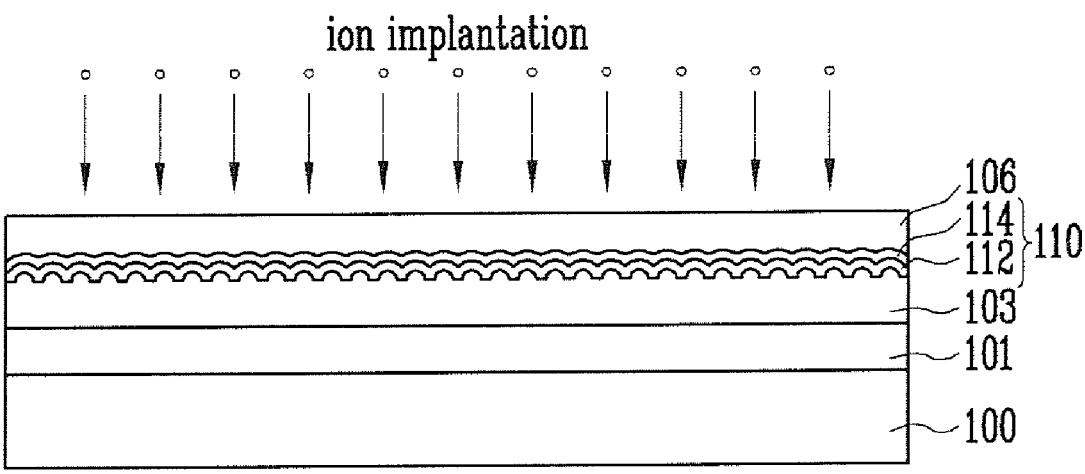
Figure 1G:
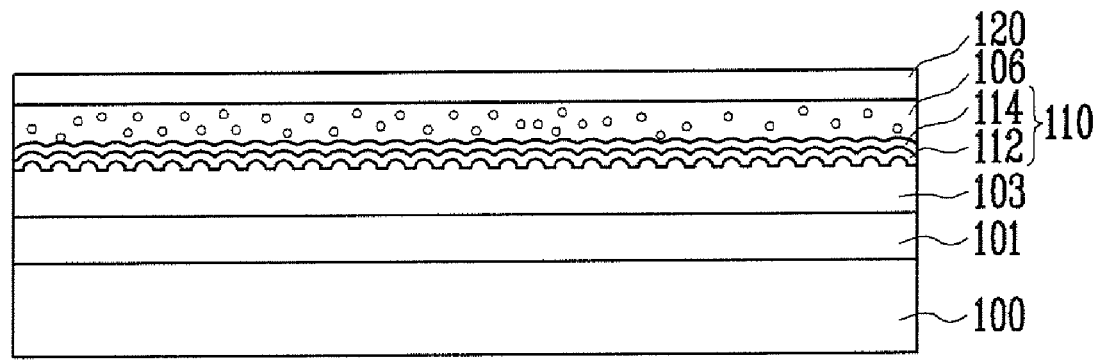
Figure 1H:
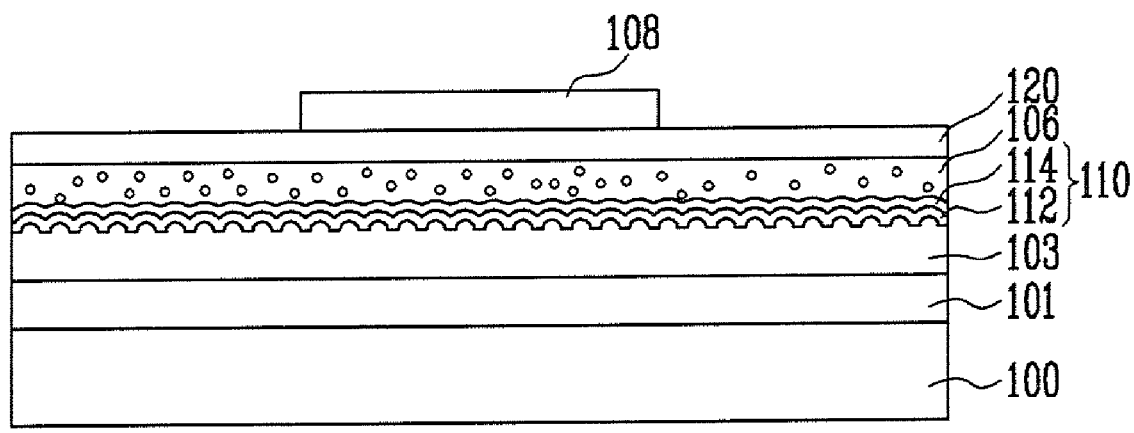
Figure 1I:
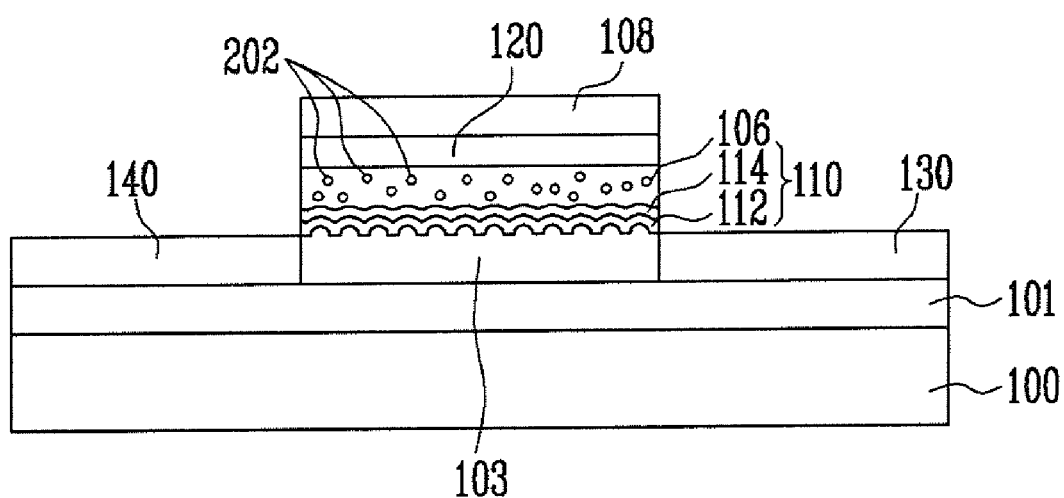

Before describing a method used to form a nonvolatile memory cell in accordance with an exemplary embodiment of the present invention, a description of the nonvolatile memory cell itself will be provided, as illustrated in FIG. 1H, which is a cross-sectional view thereof. As can be seen therein, a nonvolatile memory cell 200 includes: a glass substrate 100; a buffer oxide film 101; a polysilicon layer 103; a first insulator 110, including a sequential stack of an SiOxNy layer 112 and an $SiO_2$ layer 114; a nitride film 106, including a plurality of silicon nanocrystals 202, on the first insulator 110; a second insulator 120 on the nitride film 106; a gate electrode 108; a source 130; and a drain 140. The first insulator 110 may be a tunneling oxide film. The nitride film 106 may be a trapping film. The second insulator 120 may be a blocking oxide film.

FIGS. 1A to FIG. 1I are cross-sectional views of various operations in a method for fabricating the nonvolatile memory cell, according to an exemplary embodiment of the present invention.

First, as illustrated in FIG. 1A, the buffer oxide film 101 may be deposited on the glass substrate 100, e.g., by using a chemical vapor deposition (CVD) process. The buffer oxide film 101 may be thick enough to block impurities from moving between the glass substrate and other portions of a nonvolatile memory cell (to be formed later). The buffer oxide film 101 may have a thickness of approximately 3,000 Å.

As illustrated in FIG. 1B, an amorphous silicon layer 102 may be deposited on the buffer oxide film 101, e.g., by using a CVD process. The amorphous silicon layer 102 may have a thickness of approximately 500~600 Å. The amorphous silicon layer 102 may be irradiated with a laser beam 204.

As shown in FIG. 1C, the amorphous silicon layer 102 is changed into the polysilicon layer 103, as a result of the irradiation from a laser beam 204. For convenience, this will be illustrated using only the polysilicon layer 103. However, it will be understood that part of the amorphous silicon layer 102 may remain, i.e., the polysilicon layer 103 can comprise all or a portion of the amorphous silicon layer 102. Due to the processing of the amorphous silicon layer 102, an upper surface of the polysilicon layer 103, formed through the irradiation, may not be uniform, i.e., the surface may be rough.

The first insulator 110 may be formed on the polysilicon layer 103, as shown in FIG. 1D. The upper surface of the polysilicon layer 103 may be through at this time.

The first insulator 110 may be provided by using an oxidative deposition process, using an inductively coupled plasma CVD apparatus. The oxidation process can comprise using a nitrous oxide ($N_2O$) plasma, for example. The oxidation process may be performed at a low temperature, e.g., about 500° C., or less. The first insulator 110 may comprise a sequential stack of the silicon oxynitride (SiOxNy) layer 112 and the silicon dioxide ($SiO_2$) layer 114.

The SiOxNy layer 112 may have a thickness of approximately 10 to 20 Å, or for example, approximately 15 Å. The $SiO_2$ layer 114 may have a thickness of approximately 10 to 25 Å, or for example, approximately 15 Å.

The SiOxNy layer 112 and the SiO2 layer 114 (making up first insulator 110) may be formed by varying the concentration of nitrogen that is used while depositing the first insulator 110. For example, the concentration of nitrogen may be reduced during the deposition process of the first insulator 110. Thus, the concentration of nitrogen in the first insulator 100 may decrease as the first insulator 100 is deposited on the surface of the polysilicon layer 103. In particular, the nitrogen in the $N_2O$ plasma may be reduced to zero at some point in the process, in accordance with a desired thickness of the SiOxNy layer 112. In other words, the SiOxNy layer 112 can be differentiated from the SiO2 layer 114 based on the different concentrations of nitrogen therein. For example, the SiOxNy layer 112 can include a high concentration of nitrogen, while the $SiO_2$ layer 114 may have little or no nitrogen.

The concentration of nitrogen may be increased in the surface of the polysilicon layer 103, by forming $Si_3N_4$ at the surface of the polysilicon layer 103, at a very rapid rate, in an early stage of the oxidation process using the $N_2O$ plasma. After the predetermined time, the concentration of nitrogen in the $N_2O$ plasma may be reduced, e.g., by substituting oxygen for the nitrogen, while the first insulator 110 is deposited.

Accordingly, the first insulation layer 110 may be classified as the SiOxNy layer 112 or the $SiO_2$ layer 114, based on the nitrogen concentration therein. For example, when an insulation layer is deposited, in accordance with the above process, to a thickness of 30 Å, the first 15 Å of the insulation layer may be classified as the SiOxNy layer 112, while the portion of the insulation layer that is thicker than 15 Å may classified as the $SiO_2$ 114 layer. The concentration of nitrogen may be nearly zero at any portion of the insulation layer 110 that is thicker that 15 Å, as measured from the surface of the polysilicon. While it may be most efficient to form the SiOxNy layer 112 and the $SiO_2$ layer 114 in the same apparatus, and from the same insulation material, the layers 112 and 114 may be made from different materials and/or in different apparatuses. Further, while controlling the nitrogen content may make the layers 112 and 114 clearly defined, these layers may also have a gradient of nitrogen there through, such that the layers are not distinct.

Programming/erasing operations of the nonvolatile memory cell 200 can have less current leakage than a conventional polysilicon memory cell, because the nonvolatile memory cell 200 has improved surface characteristics.

As shown in FIG. 1E, the nitride film 106 may be formed on the first insulator 110 using, e.g., an inductively coupled plasma CVD apparatus. The thickness of the nitride film 106 can be approximately 50 to 500 Å, and is preferably approximately 250 Å.

Thereafter, as shown in FIG. 1F, a plurality of silicon ions are deposited in the nitride film 106 by ion implantation. The ion implantation can be conducted using an ion acceleration energy of from 30 to 40 keV. After the implantation, a heat treatment at about 600° C. is performed to convert the implanted silicon into silicon nanocrystals.

The silicon nanocrystals function to store charges. The nanocrystals can be disposed in the nitride film 106, in a trap region or an interface trap region between the first insulator 110 and the nitride film 106, or in an interface trap region between a nitride trap region and the second insulator 120 (FIG. 1F discussed below).

Figure 2:
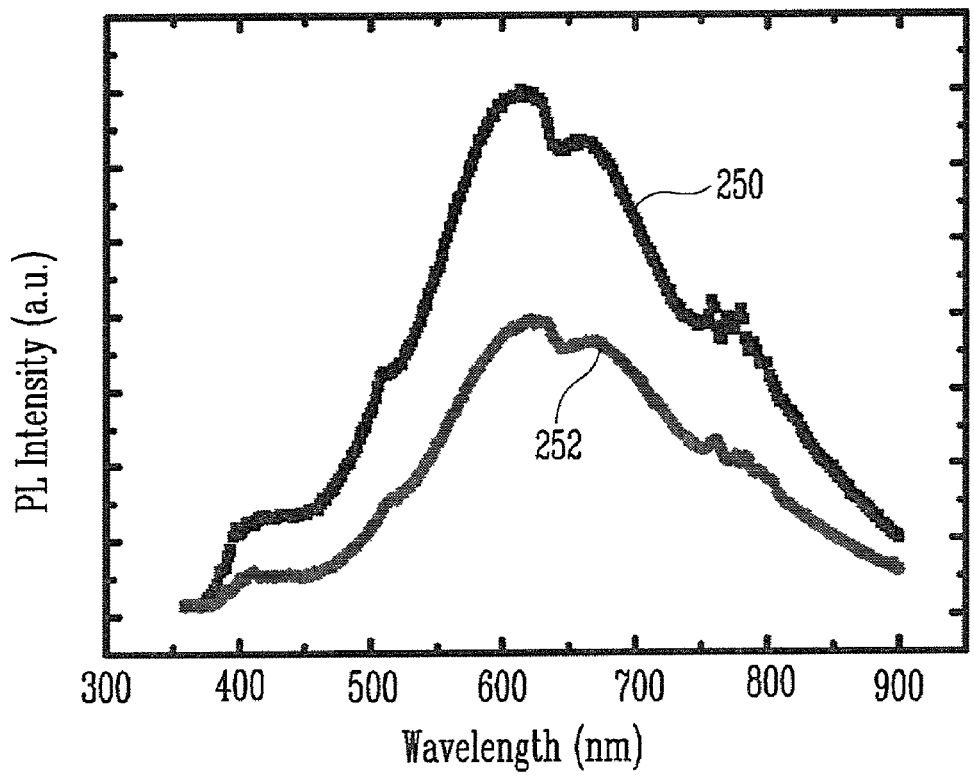
FIG. 2 is a graph of photoluminescence peaks relating to silicon nanocrystals in a nitride film, according to an exemplary embodiment of the present invention.

FIG. 2 is a graph showing a photoluminescence peak representing the formation of the amorphous silicon nanocrystals in the nitride film, according to an embodiment of the present invention.

Silicon is implanted in the deposited nitride film by an ion implantation method. FIG. 2 is a graph showing the photoluminescence peak caused by the silicon nanocrystals in the nitride film. The silicon nanocrystals are formed by performing a heat treatment on the implanted silicon. The heat treatment can be conducted at about 600°0 C.

Then, the x-axis represents the detected wavelengths. The y-axis represents the intensity of the photoluminescence. A curve 250 represents results from a nitride film that is ion implanted with silicon, and then heat treated. A curve 252 represents the results from a nitride film that does not contain silicon nanocrystals. The peak intensity of curve 250 is greater than the peak intensity of curve 252, which indicates that the density of the silicon formed in the nitride film is higher. Curve 250 has a peak at from 600 to 620 nm, indicating that the nanocrystals are about 4 nm in size.

Referring to FIG. 1G, the second insulator 120 may be formed on the nitride film 106, e.g., using an inductively coupled plasma CVD apparatus. The second insulator 120 may have a thickness of from approximately 50 to 200 Å, e.g., approximately 125 Å. The second insulation layer 120 can insulate the nitride film 106 from the gate electrode 108.

The gate electrode 108 may be formed by depositing and/or patterning a metal on the second insulator 120, followed by carrying out a lithographic etching process, as shown in FIG. 1H.

The source 130 and the drain 140 may be formed by carrying out a lithographic etching process to expose portions of the polysilicon layer 103, and then injecting impurity ions into the exposed portions, as shown in FIG. 1H.

Figure 3:
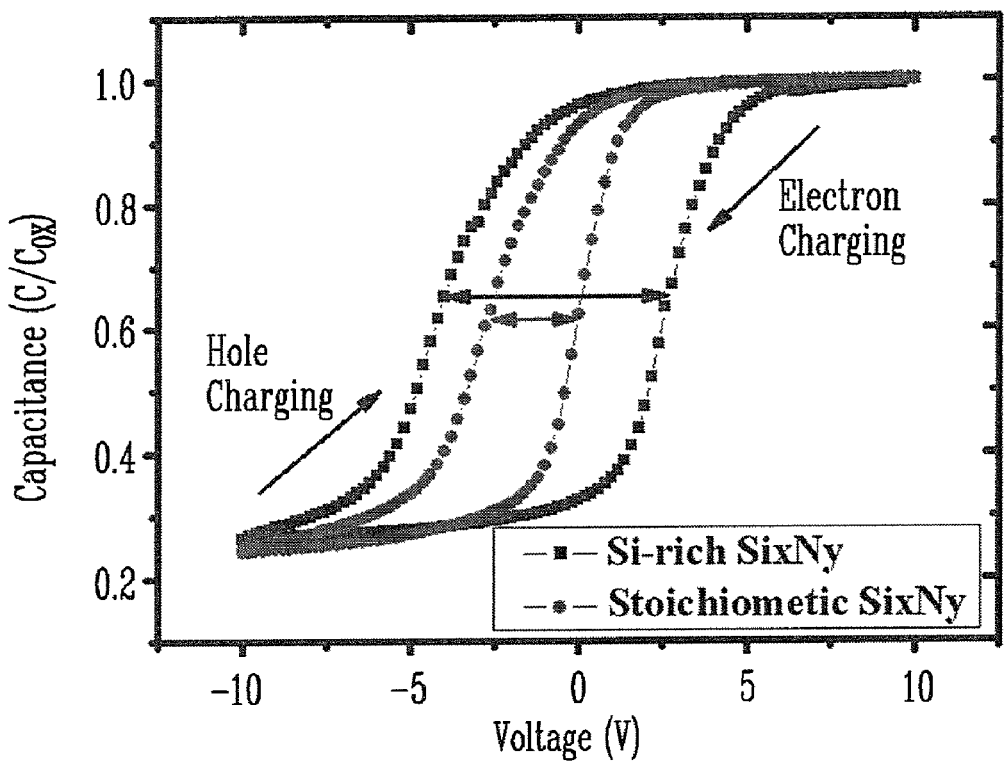
FIG. 3 is a diagram showing the C-V characteristics of nonvolatile memory cells according to an exemplary embodiment of the present invention.

FIG. 3 illustrates a diagram showing the C-V characteristics of a nonvolatile memory cell, according to an exemplary embodiment of the present invention.

As can be seen in FIG. 3, more electrons can be stored in a nitride film comprising silicon nanocrystals than in a conventional nitride film.

More specifically, in the C-V curve for the conventional nitride film, the flat-band voltage shift is smaller than the flat-band voltage shift of the C-V curve for the nitride film including silicon nanocrystals. Therefore, it can be confirmed that the charge storing effect remarkably increases in the nitride film containing silicon nanocrystals.

The graph of FIG. 3 was obtained using silicon implanted in a nitride film, at an acceleration voltage of 30 keV, followed by a heat treatment at 600° C.

The importance of nonvolatile semiconductor memories has been emphasized together with dynamic random access memories (DRAMs) and static random access memories (SRAMs). Unlike volatile random access memories (RAMs) that temporarily store used data, nonvolatile memory devices can maintain stored data even if power is cut off. In particular, electrically erasable and programmable read only memories (EEPROMs) are considered as preferable among the nonvolatile memories, because EEPROMs are capable of programming and erasing data, and readily rewriting data. EEPROMs can be typically categorized as either bit erase memories capable of erasing and reading data in bits, or flash memories capable of erasing data in blocks of several tens to several hundred bytes, or more, and writing in bits. Because the bit erase memory may selectively erase and program data in bits, the bit erase memory is easily used and applied. However, the bit erase memory needs two transistors, i.e., a memory transistor and a selection transistor, therefore, a chip size is large, and the corresponding price is high. On the other hand, the flash memory is capable of programming data in bits, and erasing in bits, or in blocks. Since a memory cell of the flash memory includes one transistor, the area of the cell is relatively small.

The flash memories are typically classified into NOR-type and NAND-type architectures. In the NOR-type architecture, cells are disposed in parallel between a bit line and a ground. In the NAND-type architecture, cells are disposed in series between a bit line and a ground.

In the NOR-type architecture, floating gate memory cells of a memory array are arranged in a matrix. The gates of each floating gate memory cell of the array matrix are coupled by rows to word lines, and their drains are coupled to column bit lines. The source of each floating gate memory cell is typically coupled to a common source line. The NOR architecture floating gate memory array is accessed by a row decoder activating a row of floating gate memory cells by selecting the word line coupled to their gates. The row of selected memory cells couple stored data values on respective column bit lines by providing differing current characteristics between the coupled source line to the coupled column bit lines corresponding to a programmed state or unprogrammed state.

The NAND array architecture also arranges its array of floating gate memory cells in a matrix having the gates of each floating gate memory cell of the array coupled by rows to word lines. However, each memory cell is not directly coupled to a source line and a column bit line. Instead, the memory cells of the array are arranged together in "strings," typically of 16 to 32 memory cells each, where the memory cells in the string are coupled together in series between a common source line and a column bit line. The NAND architecture floating gate memory array is then accessed by a row decoder activating a row of floating gate memory cells by selecting the word select line coupled to their gates. In addition, the word lines coupled to the gates of the unselected memory cells of each string are also driven. However, the unselected memory cells of each string are typically driven by a higher gate voltage in order to operate them as pass transistors to allow them to pass current in a manner that is unrestricted by their respective stored data values. Under this condition, current flows from the source line to the column bit line through each floating gate memory cell of the series coupled string, restricted only by the memory cells of each string that are selected to be accessed. As a result, the current encoded stored data values of the row of selected memory cells are coupled to the column bit lines.

Figure 4A:
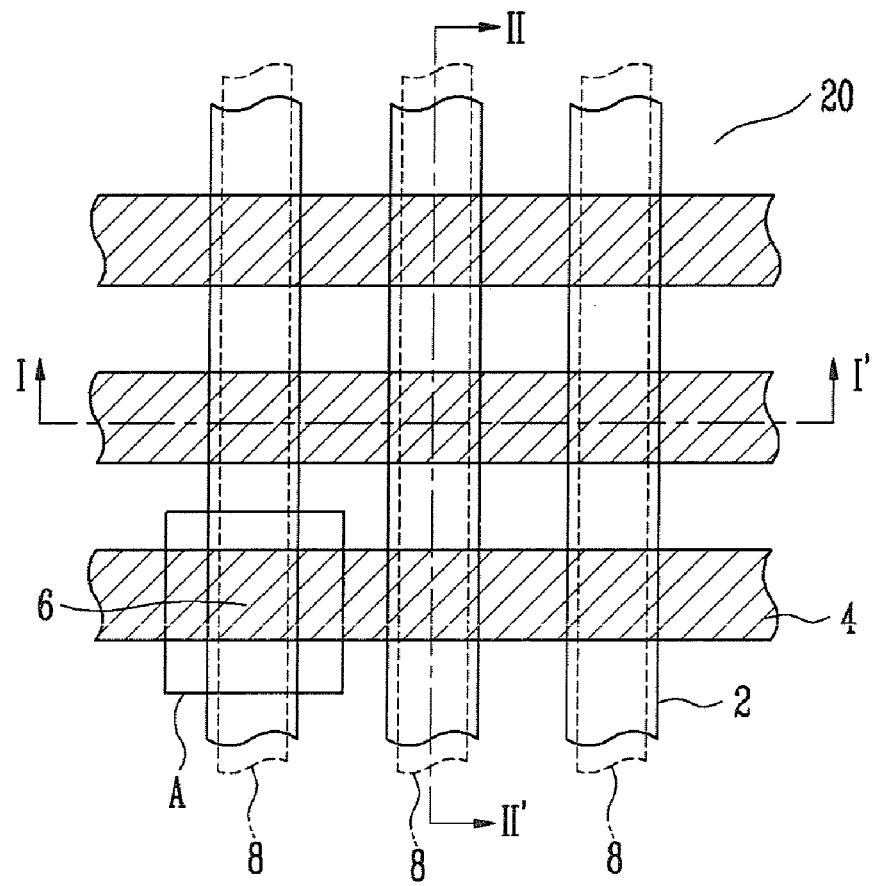
FIG. 4A is a plan view showing a NAND-type array of nonvolatile memory cells.
Figure 4B:
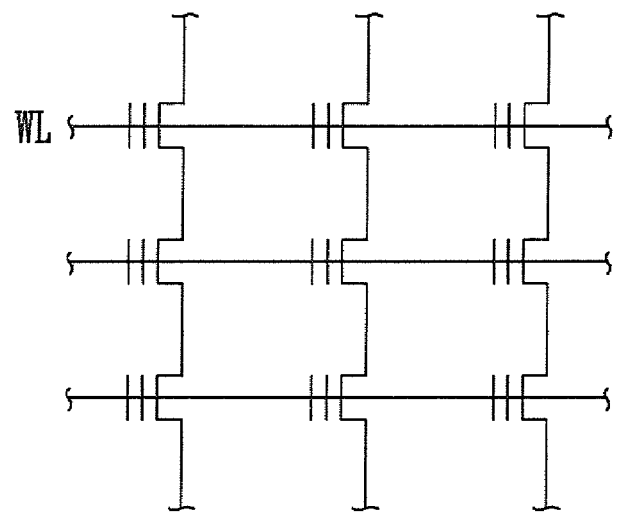
FIG. 4B is an equivalent circuit diagram of FIG. 4A.

FIG. 4A is a plan view representing a memory apparatus comprising an array of nonvolatile memory cells having the NAND type architecture. FIG. 4B is an equivalent circuit diagram.

Referring to FIG. 4A, an array 20 of memory cells comprises at least one active region 2 and at least one word line 4. An active region can comprise a bit line 8. The array 20 comprises at least one gate electrode 6, where a bit line 8 and a word line 4 cross one another. The memory array 20 can comprise a number of memory cells 22. A memory cell 22 can be memory cell according to an embodiment of the present teachings.

FIG. 4B depicts a circuit diagram of the array 20 of FIG. 4A.

Figure 5A:
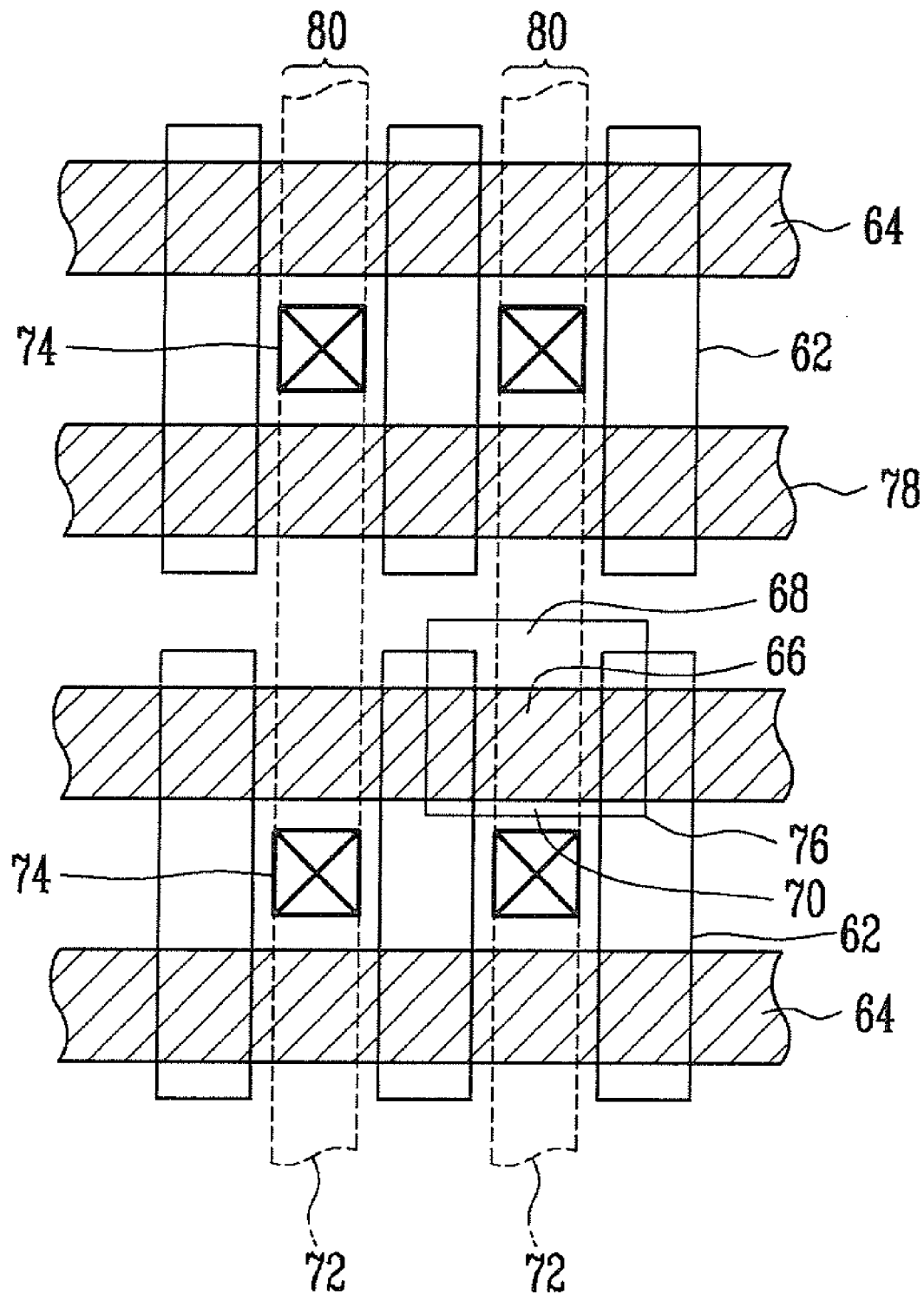
FIG. 5A is a plan view showing a NOR-type array of nonvolatile memory cells.
Figure 5B:
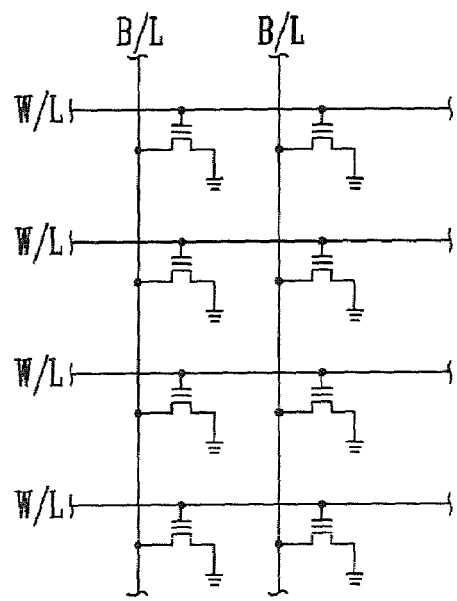
FIG. 5B is an equivalent circuit diagram of FIG. 4A.

FIG. 5A is a plan view representing an array of nonvolatile memory cells having a NOR type architecture. FIG. 5B is an equivalent circuit diagram.

Referring to FIG. 5, an array 78 of memory cells that comprises word lines 64, bit lines 72, and field regions 62. The field regions 62 define the boundaries of an active region 80. The word lines 64 are disposed in parallel, and cross the active region 80 and the field regions 62. Gate electrodes 66 are disposed where the word lines 64 cross the active region. Source regions 68 and drain regions 70 are disposed above and below the gate electrodes 66. The source regions 68 and the drain regions 70 can comprise portions of the active region 80 that are ion-implanted with impurities. Contacts 74 are formed adjacent to the drain regions 70. The bit lines 72 are disposed in parallel to each other and orthogonally to the word lines 64. The memory array 78 can comprise a number of cells 76.

The cells 76 can comprise nonvolatile memory cells according to the various embodiments of the present invention, for example, as described with reference to FIGS. 1A-1I.

Functionally, the random reading speed of a NAND-type array is slower than that of a NOR array. Furthermore, a NAND-type array erases data from a group of cells at a time, rather than from a single cell at a time. On the other hand, since a NAND-type array can have a smaller cell area, the cost per cell is lower.

A nonvolatile memory cell according to an embodiment of the present invention can be included in a flat panel display device, such as, an organic light emitting display device.

Figure 6:
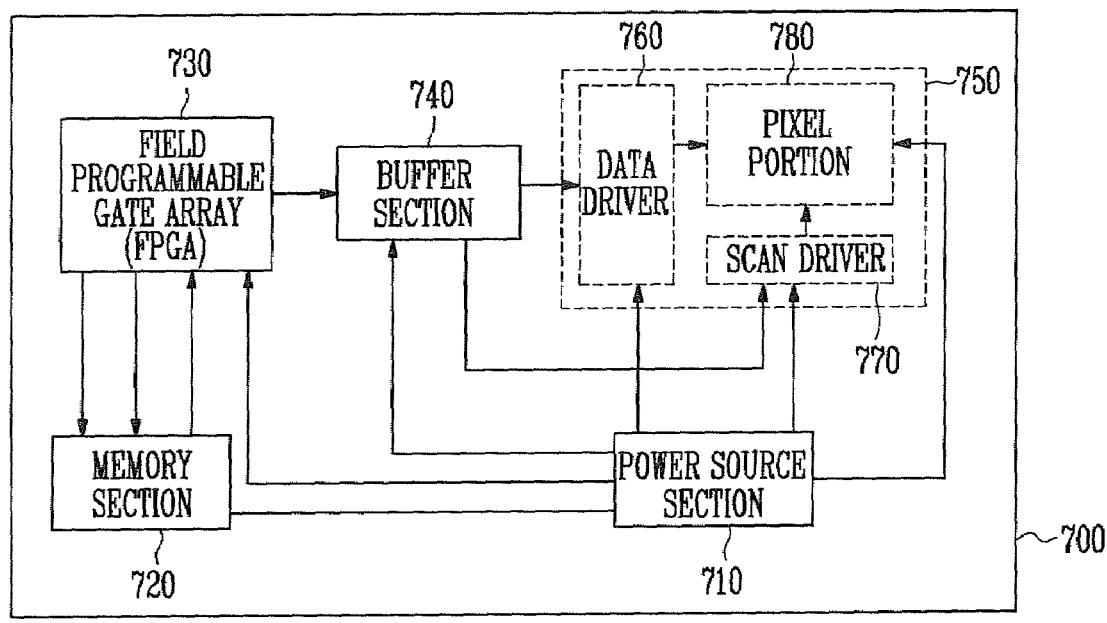
FIG. 6 is a block diagram showing a flat panel display device, according to an exemplary embodiment of the present invention.

FIG. 6 is a block diagram showing the components of a flat panel display device according to an embodiment of the present invention. Although an organic light emitting display device is exemplified among flat panel display devices, the flat panel display device according to an exemplary embodiment of the present invention is not limited to organic light emitting display devices.

Referring to FIG. 6, a display device 700 includes a power source section 710, a memory section 720, a field programmable gate array (FPGA) 730, a buffer section 740, and a panel section 750.

The power source section 710 receives a voltage from a power supply, and can step down the voltage. The stepped down voltage is divided, and transferred to different components of the display device 700. In particular, the power source section 710 can vary the voltage from the power source and transfer the voltage to the memory section 720, the field programmable gate array 730, the buffer section 740, and a panel section 750.

The memory section 720 comprises a nonvolatile memory cell which has been explained with reference to FIGS. 1A-1I, 4, and 5.

The data stored in the memory section 720 is promptly transferred to the program section 730. The field programmable gate array 730 receives data from the memory section 720, according to a logic program disposed therein, and transfers a command signal and an address signal to the memory section 720. For example, the memory section 720 designates an address of the memory section 720, according to the command signal and the address signal, and outputs the data corresponding to the address to the field programmable gate array 730. Therefore, the program and control signal data received by the field programmable gate array is transferred to the buffer section 740. In the buffer section 740, the control signal controls the distribution of the program signal to the panel section 750.

The buffer section 740 is a memory device that can temporarily store information, and can compensate for time and information flow speed differences generated when such information is transmitted from one unit to another.

The panel section 750 includes a pixel section 780, a data driving section 760, and a scan driving section 770. The pixel section 780 can include an organic light emitting device. The panel section 750 receives the program signal and the control signal from the buffer section 740, and controls the light emission of the pixel portion 780, using the data driver 760 and the scan driver 770.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

As mentioned above, an excessive current leakage due to a rough surface of a polysilicon layer, generated by irradiation of a laser to an amorphous silicon layer, can be reduced. A nonvolatile memory cell can be fabricated on a glass substrate using a low temperature process, by forming a first oxide film, including a silicon oxynitride (SiOxNy) layer, by using the nitrous oxide ($N_2O$) plasma. A plurality of silicon nanocrystals can be formed in the nitride film by implanting silicon atoms in the nitride film, by an ion implantation method, and heat treating the implanted atoms.

In other words, since the nonvolatile memory cell can be fabricated on the glass substrate without using a high temperature process, the present invention can be applied to a flat panel display device.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A nonvolatile memory cell, comprising:
   a substrate;
   a buffer oxide film on the substrate;
   a polysilicon layer on the buffer oxide film;
   a first insulator, comprising a sequential stack of a silicon oxynitride (SiOxNy) layer and a silicon dioxide ($SiO_2$) layer, on the polysilicon layer;
   a nitride film, comprising a plurality of silicon nanocrystals, on the first insulator;
   a second insulator on the nitride film;
   a gate electrode on the second insulator;
   a source; and
   a drain,
   wherein the source and the drain are disposed adjacent to the polysilicon layer.

2. The nonvolatile memory cell of claim 1, wherein the plurality of silicon nanocrystals comprise ion implanted, heat treated silicon.

3. The nonvolatile memory cell of claim 1, wherein the nitride film is from approximately 50 to 500 Å thick.

4. The nonvolatile memory cell of claim 1, wherein the first layer is formed by oxidizing a nitrous oxide plasma in an inductively coupled plasma CVD apparatus.

5. The nonvolatile memory cell of claim 1, wherein the SiOxNy layer is from approximately 10 to 20 Å thick.

6. The nonvolatile memory cell of claim 1, wherein the $SiO_2$ layer is from approximately 10 to 25 Å thick.

7. The nonvolatile memory cell of claim 1, wherein the source and the drain comprise impurities implanted therein.

8. An array of nonvolatile memory cells, comprising:
   a field region defining an active region;
   a word line crossing the active region and the field region; and
   nonvolatile memory cells disposed at intersections of the word line and the active region,
   wherein the nonvolatile memory cells comprise:
      a buffer oxide film on a substrate;
      a polysilicon layer on the buffer oxide film;
      a first insulator comprising a sequential stack of a silicon oxynitride (SiOxNy) layer and a silicon dioxide ($SiO_2$) layer on the polysilicon layer;
      a nitride film comprising a plurality of silicon nanocrystals on the first insulator;
      a second insulator on the nitride film;
      a gate electrode on the second insulator;
      a source; and
      a drain,
      wherein the source and the drain are disposed adjacent to the polysilicon layer.

9. The array of claim 8, wherein the plurality of silicon nanocrystals comprise ion implanted, heat treated silicon.

10. The array of claim 8, wherein the array comprises one of a NAND-type architecture and a NOR-type architecture.

11. A nonvolatile memory cell for a flat panel display device comprising a power source section, a memory section, a program section, a buffer section, and a panel section, wherein the memory section comprises the nonvolatile memory cell, the nonvolatile memory cell comprising:
   a buffer oxide film on a substrate;
   a polysilicon layer on the buffer oxide film;
   a first insulator comprising a sequential stack of a silicon oxynitride (SiOxNy) layer and a silicon dioxide ($SiO_2$) on the polysilicon layer;
   a nitride film comprising a plurality of silicon nanocrystals on the first insulator;
   a second insulator on the nitride film;
   a gate electrode on the second insulator;
   a source; and
   a drain,
   wherein the source and the drain are disposed adjacent to the polysilicon layer.

12. The nonvolatile memory cell of claim 11, wherein the plurality of silicon nanocrystals comprise ion implanted, heat treated silicon.

13. A method for fabricating a nonvolatile memory cell, the method comprising:
   forming a buffer oxide film on a substrate;
   forming a polysilicon layer on the buffer oxide film;
   forming a first insulator comprising a sequential stack of a silicon oxynitride (SiOxNy) layer and a silicon dioxide ($SiO_2$) layer, on the polysilicon layer;
   forming an nitride film on the first insulator;
   forming a plurality of silicon nanocrystals in the nitride film;
   forming a second insulator on the nitride film;
   forming a gate electrode on the second insulator; and
   forming a source and a drain in exposed regions of the polysilicon layer.

14. The method of claim 13, wherein the forming of the polysilicon layer comprises irradiating an amorphous silicon layer disposed on the buffer oxide film.

15. The method of claim 14, wherein the irradiating comprises using a laser beam.

16. The method of claim 13, wherein the forming of the first insulator comprises oxidizing a nitrous oxide plasma in an inductively coupled plasma CVD apparatus.

17. The method of claim 13, wherein the SiOxNy layer comprises a higher concentration of nitrogen than the $SiO_2$ layer.

18. The method of claim 13, wherein the forming of the source and the drain, comprises:
   removing the second insulator, the nitride film, and the first insulator; and
   implanting impurities in the polysilicon layer.

19. The method of claim 13, wherein the forming of the plurality of the silicon nanocrystals comprises:
   ion implanting silicon in the nitride film; and
   heating the implanted silicon to form the silicon nanocrystals.

20. The method of claim 19, wherein the heating comprises heating to a temperature of about 600° C.

21. The method of claim 13, wherein the SiOxNy layer comprises a higher concentration of nitrogen than the $SiO_2$ layer.

22. The method of claim 13, wherein the chemical vapor deposition comprises a nitrous oxide plasma oxidation deposition.

23. The method of claim 16, wherein the forming of the first insulator further comprises lowering the concentration of the nitrogen in the nitrous oxide plasma as the first insulator is formed.

* * * * *